United States Patent
Vasani et al.

(10) Patent No.: US 8,964,923 B2
(45) Date of Patent: Feb. 24, 2015

(54) LOW LATENCY HIGH BANDWIDTH CDR ARCHITECTURE

(75) Inventors: Anand Jitendra Vasani, Irvine, CA (US); Jun Cao, Irvine, CA (US); Afshin Momtaz, Laguna Hills, CA (US)

(73) Assignee: Broadcom Corporation, Irvine, CA (US)

( * ) Notice: Subject to any disclaimer, the term of this patent is extended or adjusted under 35 U.S.C. 154(b) by 638 days.

(21) Appl. No.: 13/168,861

(22) Filed: Jun. 24, 2011

(65) Prior Publication Data

US 2012/0328063 A1  Dec. 27, 2012

(51) Int. Cl.
*H04L 25/00* (2006.01)
*H04L 7/00* (2006.01)
*H03L 7/081* (2006.01)
*H04L 7/033* (2006.01)

(52) U.S. Cl.
CPC .............. *H04L 7/0079* (2013.01); *H04L 7/033* (2013.01); *H03L 7/0812* (2013.01)
USPC .......................................... 375/371; 375/226

(58) Field of Classification Search
CPC ................................ H03L 7/00; H04L 7/0079
USPC .................................... 375/371, 372, 358, 226
See application file for complete search history.

(56) References Cited

U.S. PATENT DOCUMENTS

| | | | | |
|---|---|---|---|---|
| 6,002,279 A | * | 12/1999 | Evans et al. | 327/144 |
| 7,688,687 B2 | * | 3/2010 | Okamoto et al. | 369/30.25 |
| 7,796,652 B2 | * | 9/2010 | Reitlingshoefer et al. | 370/535 |
| 8,180,011 B2 | * | 5/2012 | Do et al. | 375/371 |
| 8,537,955 B1 | * | 9/2013 | Keane et al. | 375/376 |
| 2008/0191772 A1 | * | 8/2008 | Pickering et al. | 327/243 |

* cited by examiner

*Primary Examiner* — Qutbuddin Ghulamali
(74) *Attorney, Agent, or Firm* — Oblon, Spivak, McClelland, Maier & Neustadt, L.L.P.

(57) ABSTRACT

Provided is a low latency high bandwidth clock and data recovery (CDR) system. For example, there is a low latency high bandwidth CDR system including a demultiplexer configured to convert a high frequency input datastream to a low frequency output datastream according to a first latency and a phase error processor at least partially embedded into the demultiplexer and configured to determine a datastream phase error of the high frequency input datastream according to a second latency. The embedded phase error processor allows a portion of a total latency of the CDR system due to the demultiplexer and the phase error processor to be less than a sum of the first and second latencies.

24 Claims, 6 Drawing Sheets

| pd_err_0<1:0> | pd_err_1<1:0> | Sum_<1:0> |
|---|---|---|
| 00(0) No Tran | 00(0) No Tran | 00(0) |
| 01(1) Early | 00(0) No Tran | 01(1) |
| 00(0) No Tran | 01(1) Early | 01(1) |
| 11(-1) Late | 00(0) No Tran | 11(-1) |
| 00(0) No Tran | 11(-1) Late | 11(-1) | pd_err_0<1:0> and pd_err_1<1:0>
are consecutive phase errors

LOW LATENCY HIGH BANDWIDTH CDR ARCHITECTURE

BACKGROUND OF THE INVENTION

1. Field of the Invention

The present invention relates generally to data transmission. More particularly, the present invention relates to reception of data transmissions.

2. Background Art

Clock and data recovery (CDR) circuitry may be used to extract both data and a clock from a transmitted datastream, thereby eliminating reliance on a separate clock signal that would otherwise be transmitted substantially alongside the datastream and would typically require an additional and relatively expensive transmission path. In particular, digital CDRs are widely used for their flexibility and simplicity.

However, conventional digital CDRs typically exhibit an inherent disadvantage with respect to high latency because their phase errors and loop parameters are processed in a digital domain after significant pre-processing, such as de-serialization, has been performed on an input data stream. This high latency attribute detrimentally decreases a high frequency jitter tolerance for conventional digital CDRs.

For example, a loop bandwidth for a conventional digital CDR needs to be increased to accurately track jitter of higher frequency input datastreams. However, increasing loop bandwidth without sealing down overall latency may result in unstable loop behavior and degradation in high frequency jitter tolerance. Thus, for jitter tolerance to remain substantially constant as input frequencies increase, an overall latency of the conventional digital CDR should scale down accordingly in order to allow for a commensurate increase in loop bandwidth. Unfortunately, decreasing latency of a conventional digital CDR often results in CDR timing violations due to a higher susceptibility to process, voltage and temperature variations, and can typically only be done at the cost of reduced functionality and features. Thus, reliably scaling overall latency of a conventional digital CDR with input datastream frequency becomes almost insurmountably difficult to accomplish as data rates increase, particularly for 10 Gbps input datastreams or higher.

Accordingly, there is a need to overcome the drawbacks and deficiencies in the art by providing a low latency high bandwidth CDR architecture such that its overall latency can more easily scale with high frequency input datastreams.

SUMMARY OF THE INVENTION

The present application is directed to a low latency high bandwidth clock and data recovery architecture, substantially as shown in and/or described in connection with at least one of the figures, as set forth more completely in the claims.

BRIEF DESCRIPTION OF THE DRAWINGS

The features and advantages of the present invention will become more readily apparent to those ordinarily skilled in the art after reviewing the following detailed description and accompanying drawings, wherein.

DETAILED DESCRIPTION OF THE INVENTION

Figure 1:
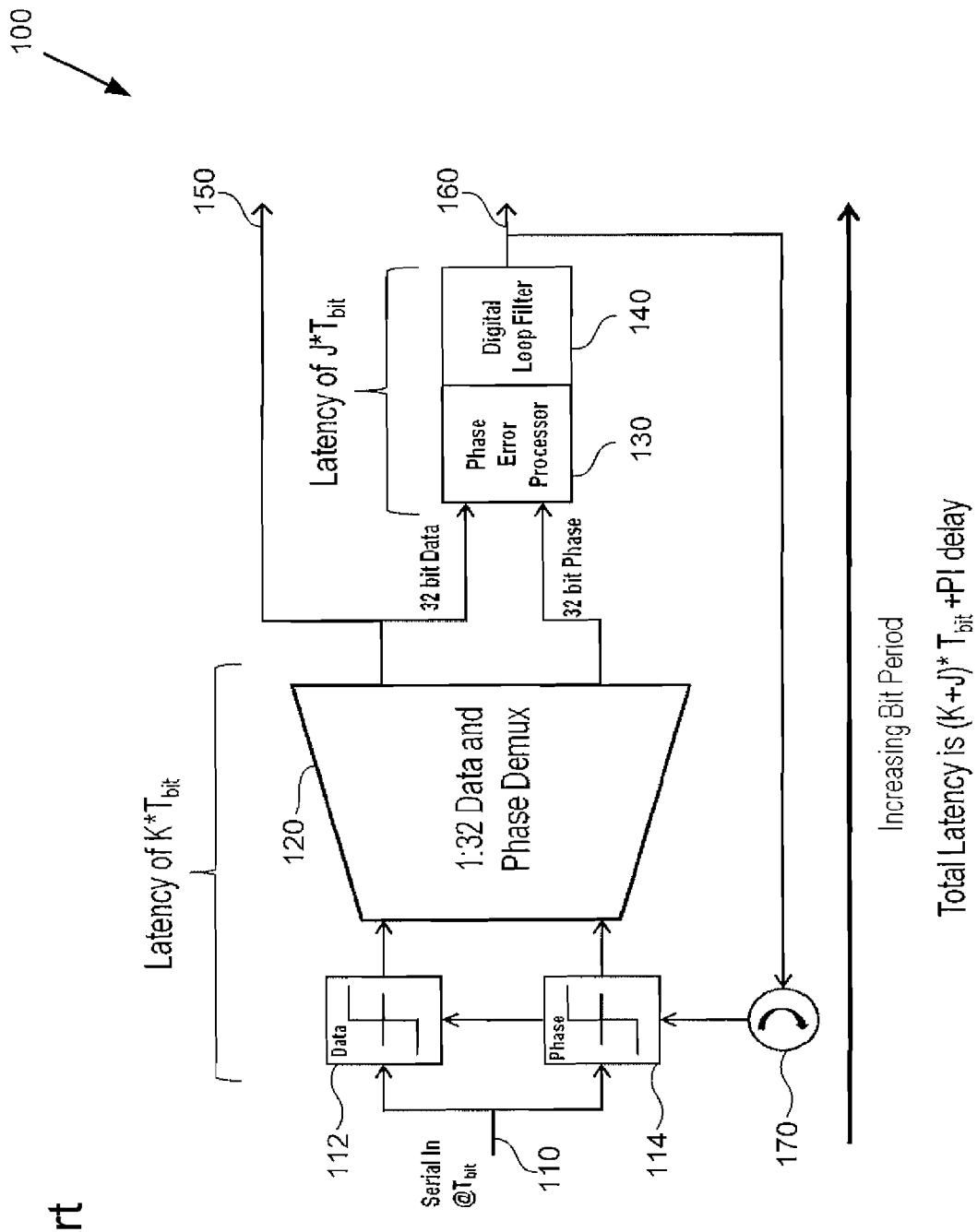
FIG. 1 presents a diagram of a conventional digital clock and data recovery (CDR) architecture.

The present application is directed to a low latency high bandwidth clock and data recovery (CDR) architecture or system. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention, which use the principles of the present invention, are not specifically described in the present application and are not specifically illustrated by the present drawings. Unless noted otherwise, like or corresponding elements among the figures may be indicated by like or corresponding reference numerals. Moreover, the drawings and illustrations in the present application are generally not to scale, and are not intended to correspond to actual relative dimensions.

Embodiments of the present inventive concepts may reduce CDR latency by, for example, embedding a portion of CDR operations into a demultiplexer. Such embedding can simplify such CDR operations, which can significantly reduce latency of the CDR. As a result, embodiments of the present inventive concepts may reduce CDR latency without sacrificing system functionality or reliability. Further, as will be explained more fully below, embodiments of the present inventive concepts may further reduce CDR latency by maximizing a portion of CDR operations that can be embedded into a demultiplexer.

FIG. 1 shows conventional CDR architecture 100 that suffers from a relatively high and difficult to scale latency. Conventional CDR architecture 100, as shown in FIG. 1, comprises input 110, data and phase samplers 112 and 114, conventional demultiplexer 120, conventional phase error processor 130, conventional digital loop filter 140, output 150, loop output 160, and phase interpolator 170. Under typical operating conditions, conventional CDR architecture 100 receives an input datastream at input 100 and, when properly phase and frequency locked to the input datastream, provides a recovered data datastream at output 150 and a recovered clock that can be derived from loop output 160. In some embodiments, phase interpolator 170 and loop output 160 may be used in tandem to derive a recovered clock, for example, which may be provided as an output of phase interpolator 170.

In detail, when an input datastream is received at input 110, data and phase samplers 112 and 114 may be configured to segment the input datastream into a first datastream representing the data transmitted within the datastream and a second datastream representing the signal edges of the data transmitted within the datastream, also referred to as the phase of the input datastream. Typically, the input datastream comprises a serialized stream of successive bits of data, or a bitstream, but in some embodiments it may be instead be a datastream having a bit width greater than a single bit.

Conventional demultiplexer 120 is typically configured to convert relatively narrow high frequency input datastreams and produce relatively wide low frequency output datastreams according to a first latency primarily due to the conversion operation. As shown in FIG. 1, conventional demultiplexer 120 may be configured to convert a high frequency serialized bitstream into a lower frequency parallelized 32-bit datastream and, with respect to the data of the input datastream, deliver the 32-bit datastream to conventional phase error processor 130 and output 150. When conventional CDR architecture is locked to an input datastream, conventional demultiplexer 120 may deliver a recovered data datastream to output 150, which can then be processed by other portions of a larger system incorporating a CDR according to conventional CDR architecture 100.

As is also shown in FIG. 1, conventional demultiplexer 120 may be additionally configured to convert a serialized phase of the input data stream into a separate, lower frequency parallelized 32-bit datastream that is delivered to conventional phase error processor 130. Once conventional phase error processor 130 has both the data and phase parallelized 32-bit datastreams, it may then determine a datastream phase error of the input datastream according to a second latency primarily due to the datastream phase error determination operation, and then provide the datastream phase error to conventional digital loop filter 140. Conventional digital loop filter 140 may be configured to use the datastream phase error provided by conventional phase error processor 130 to provide loop output 160 according to a third latency primarily due to a loop filter operation. When conventional CDR architecture 100 is locked, loop output 160 may comprise a control signal, for example, that can be used to produce a recovered clock that can be utilized by other portions of a larger system incorporating a CDR according to conventional CDR architecture 100, as explained above.

Briefly, for conventional CDR architecture 100 to be locked to an input datastream and provide recovered data and a recovered clock, as outlined above, phase interpolator 170 may be configured to accept loop output 160 and provide clock signals to data and phase samplers 112 and 114 such that data sampler 112 accurately samples data transmitted in the input datastream and phase sampler 114 accurately samples edges of data transmitted in the input datastream. If, instead, conventional phase error processor 130 detects a datastream phase error resulting from inaccurate sampling of data and phase of the input datastream, conventional digital loop filter 140 may be configured to use such datastream phase error to produce a loop output for phase interpolator 170 that allows phase interpolator 170 to compensate, at least incrementally, for the datastream phase error and the inaccurate sampling. Once such datastream phase error and inaccurate sampling is corrected, conventional CDR architecture 100 is considered locked to the input datastream.

As presented in FIG. 1, a total latency of conventional digital CDR is at least the sum of the latencies of conventional demultiplexer 120, conventional phase error processor 130, conventional digital loop filter 140, and phase interpolator 170. Furthermore, all CDR operations associated with conventional phase error processor 130 and conventional digital loop filter 140 are performed at the low frequency side of conventional demultiplexer 120, which typically relegates them to relatively slow and high latency digital implementations. As is known in the art, digital implementations may be unable to reliably operate at frequencies as high as those attainable by analog implementations, for example, and thus digital implementations are often a source of high latencies that do not fully scale with, for example, the frequency of an input datastream. Such high latencies that do not scale well limit the ability of conventional digital CDR architecture 100 to keep jitter tolerances substantially constant as input datastream frequencies increase, and so embodiments of conventional digital CDR architecture 100 are typically relegated to use with relatively low input frequencies to ensure stable and reliable operation.

Figure 2:
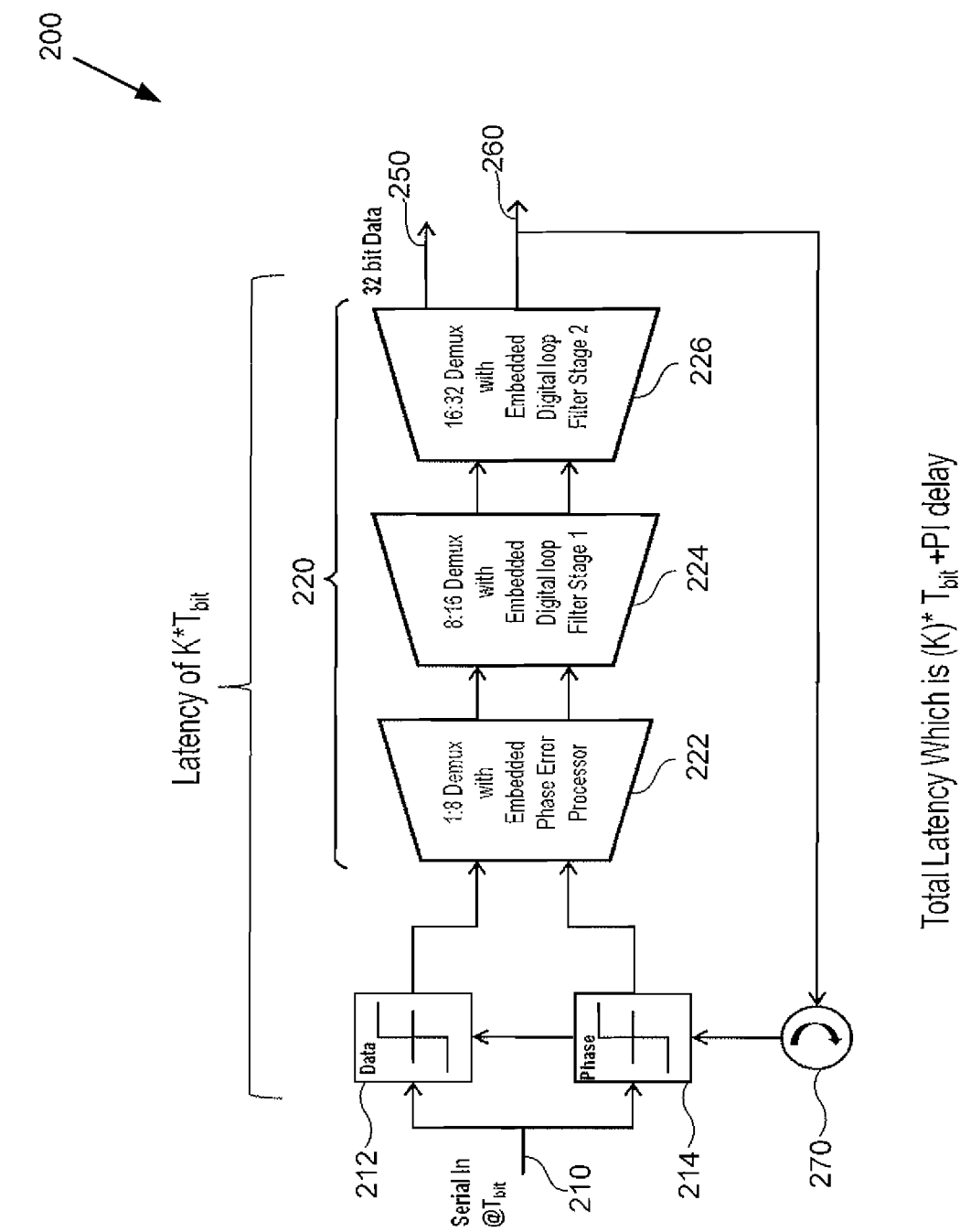
FIG. 2 presents a diagram of a low latency high bandwidth CDR architecture, according to one embodiment of the present invention.

FIG. 2 shows fully embedded CDR architecture 200 configured to address at least some of the undesirable limitations of conventional CDR architecture 100 presented in FIG. 1. Input 210, data and phase samplers 212 and 214, output 250, loop output 260, and phase interpolator 270 of FIG. 2 correspond respectively to input 110, data and phase samplers 112 and 114, output 150, loop output 160, and phase interpolator 170 in FIG. 1; e.g., each may be configured to exhibit the same features and/or operate substantially the same as its counterpart. For example, loop output 260, similar to loop output 160 in FIG. 1, may be configured to supply a control signal that may be used to produce a recovered clock to other portions of a larger system incorporating a CDR according to fully embedded CDR architecture 200.

However, fully embedded CDR architecture 200 also comprises demultiplexer 220 different from conventional demultiplexer 120 in FIG. 1. Demultiplexer 220 of FIG. 2 may comprise any device that can be configured to convert one or more relatively narrow high frequency input datastreams to relatively wide low frequency output datastreams, similar to demultiplexer 120 in FIG. 1, and such conversion may be performed according to a first latency primarily due to the demultiplexer operation, for example. In addition, demultiplexer 220 may also be configured to include functionality of a phase error processor that is at least partially embedded into demultiplexer 220. For example, with respect to the embodiment presented in FIG. 2, a phase error processor is fully embedded into demultiplexer 220, and, more particularly, is shown as fully embedded in first demultiplexer stage 222 of demultiplexer 220, as will be discussed more fully below. Thus, even though a phase error processor that is at least partially embedded into demultiplexer 220, such as the fully embedded phase error processor implementation shown in FIG. 2, may be configured to determine a datastream phase error according to a second latency, substantially similar to the non-embedded phase error processor 130 described above, the portion of the total latency of CDR architecture 200 due to the demultiplexer and the at least partially embedded phase error processor may be less than the sum of their respective latencies.

For example, in one embodiment, demultiplexer 220 may comprise a demultiplexer chain having one or more stages, such as demultiplexer stages 222, 224 and 226 shown in FIG. 2. As shown in FIG. 2, first demultiplexer stage 222 may include a fully embedded phase error processor, such that first demultiplexer stage 222 delivers partially demultiplexed data and a datastream phase error to second demultiplexer stage 224. Thus, in such an embodiment, a portion of a total latency of fully embedded CDR architecture 200 due to demultiplexer 220 and a phase error processor embedded into first demultiplexer stage 222 is substantially equal to a first latency of demultiplexer 220. For example, in the embodiment shown in FIG. 2, all phase error processing may be completed before first demultiplexer stage 222 completes populating second demultiplexer stage 224 with enough data, for example, that second demultiplexer stage 224 may begin populating third demultiplexer stage 226 with data. In alternative embodiments, all phase error processing may be completed before second demultiplexer stage 224 receives any data from first demultiplexer stage 222. With respect to other embodiments, this limit on a portion a total latency of fully embedded CDR architecture 200 due to demultiplexer 220 and a phase error processor embedded into first demultiplexer stage 222 is still true as long as all phase error processing is completed before demultiplexer 220 provides data at output 250, as will be described more fully below.

By at least partially embedding a phase error processor into demultiplexer 220, embodiments of the present invention ensure that a portion of a total latency of a CDR architecture due to, for example, demultiplexer 220 and the phase error processor at least partially embedded into demultiplexer 220 to be less than a sum of their individual operations' latencies, thus reducing an overall latency as compared to a conventional CDR architecture, such as conventional digital CDR architecture 100 in FIG. 1. Furthermore, as can be seen from FIG. 2, in some embodiments, a phase error processor can be fully embedded into demultiplexer 220 in such a way as to allow portions of a digital loop filter to also be partially or fully embedded into demultiplexer 220, for example.

For instance, in the embodiment shown in FIG. 2, a phase error processor may be fully embedded into first demultiplexer stage 222, allowing a first stage of a digital loop filter to be fully embedded into second demultiplexer stage 224 and a second stage of a digital loop filter to be fully embedded into third demultiplexer stage 226, such that a portion of the total latency of fully embedded CDR architecture 200 clue to demultiplexer 220, an embedded phase error processor and an embedded digital loop filter is approximately equal to a first latency primarily due to the demultiplexer operation, for example. In other embodiments, where timing and other constraints do not allow all of a digital loop filter to be embedded into demultiplexer 220, a portion of a digital loop filter may lie outside demultiplexer 220 such that a portion of the total latency of fully embedded CDR architecture 200 due to demultiplexer 220, an embedded phase error processor and a partially embedded digital loop fitter is less than a sum of a first latency primarily due to the demultiplexer operation and a third latency primarily due to a digital loop filter operation, for example, as will be discussed more fully below with respect to FIG. 3.

Because different portions of both a phase error processor and a digital loop filter may be partially or fully embedded into, for example, different stages of a demultiplexer, such as demultiplexer 220 in FIG. 2, each portion or stage of a phase error processor or a digital loop filter may be chosen so as to meet timing requirements for each demultiplexer stage. Thus, this allows embodiments of the present inventive concepts to include granular mixed signal implementations of demultiplexer 220 and each at least partially embedded portion of a phase error processor and/or digital loop filter. Furthermore, this also allows some embodiments to include significantly simplified implementations of a phase error processor and a digital loop filter, as will be explained more fully below.

For example, with respect to the embodiment show in FIG. 2, first demultiplexer stage 222 may be implemented in an analog domain so as to be able to reliably operate at very high frequencies, for example. Moreover, one or more stages of a phase error processor fully embedded into first demultiplexer stage 222 may also be implemented in an analog domain for similar reasons. Remaining demultiplexer stages and phase error processor stages may be implemented in a digital domain, for example. In some embodiments, this mixed signal implementation of an at least partially embedded phase error processor may be made possible, at least in part, because phase error processor operations may be substantially simplified at, for example, a processing stage with reduced input and output requirements as compared to, for example, those requirements of phase error processor 130 at an output of demultiplexer 120 in FIG. 1. Thus, embodiments of the present invention not only substantially reduce overall latency as compared to conventional architectures, which allows such embodiments to operate with desirable jitter tolerances at relatively high frequencies, but also provide for granular mixed signal configurations of a demultiplexer and an at least partially embedded phase error processor and/or digital loop filter that allow such embodiments to more easily scale overall latency with input frequency, with all the attendant benefits described above.

It should be noted that although demultiplexer 220 is depicted in FIG. 2 as comprising three stages and producing 32-bit parallelized data, these attributes are not meant to convey a limitation to the present inventive concepts. Other embodiments may include more or less stages, or only a single stage, for example, and may produce any number of bits of parallelized data. Furthermore, it should be understood that the lower phase path of demultiplexer 220 need not be configured to produce the same bit-width of data as the top data path, either inter-stage or as loop output 260, for example, and that each stage may be configured to transmit signals at different times along the data path and the phase path in order to take advantage of advantageous granular configurations of demultiplexer, phase error processor and digital loop filter operations, as explained above.

Figure 3:
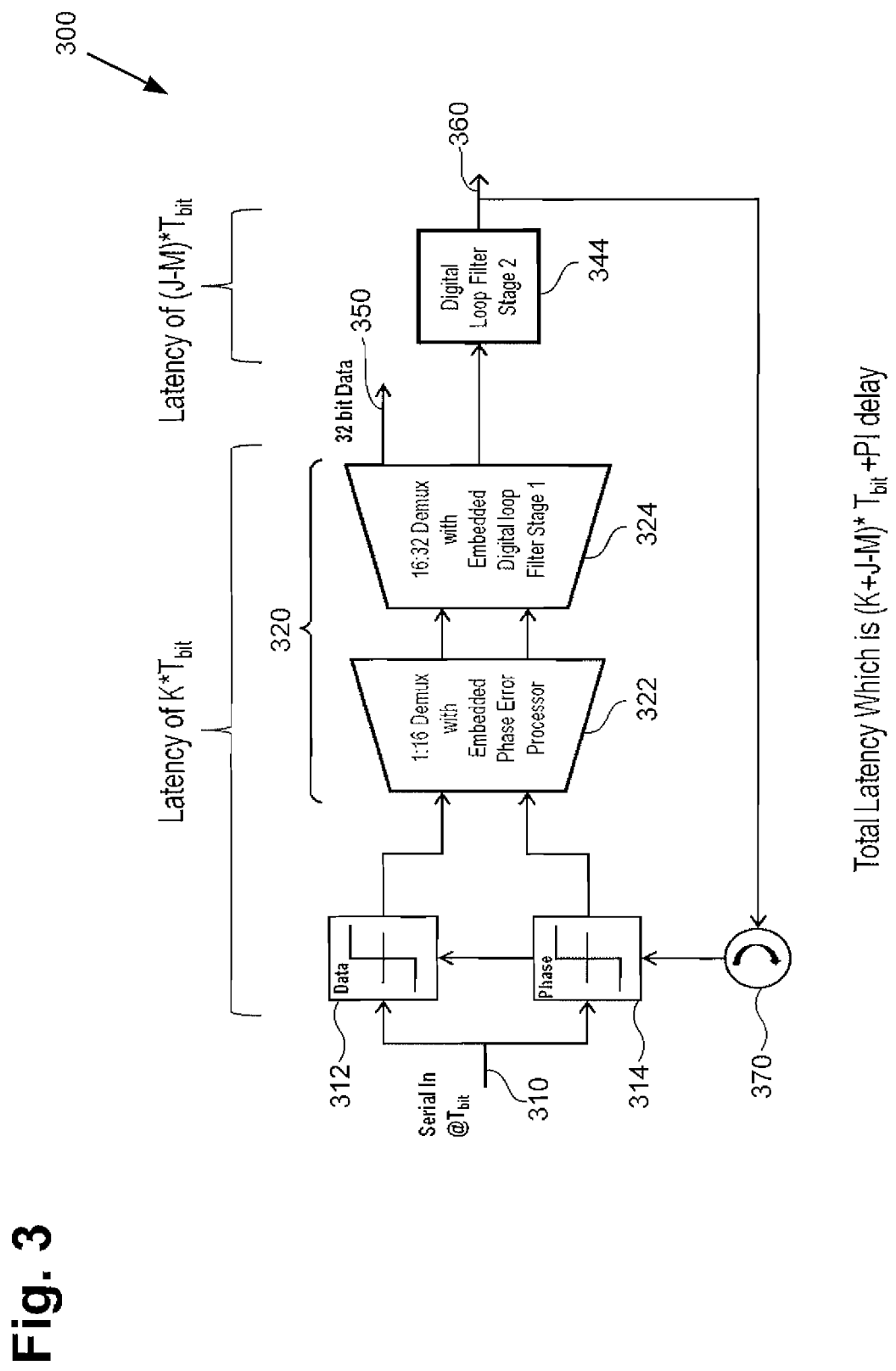
FIG. 3 presents a diagram of a low latency high bandwidth CDR architecture, according to one embodiment of the present invention.

Moving to FIG. 3, FIG. 3 illustrates an embodiment of the present inventive concepts where only a first stage of a digital loop filter may be fully embedded into demultiplexer 320 for partially embedded CDR architecture 300, for example, due to timing constraints or other design choices for partially embedded CDR architecture 300. Input 310, data and phase samplers 312 and 314, output 350, loop output 360, and phase interpolator 370 of FIG. 3 correspond respectively to input 210, data and phase samplers 212 and 214, output 250, loop output 260, and phase interpolator 270 in FIG. 2; e.g., each may be configured to exhibit the same features and/or operate substantially the same as its counterpart. For example, output 350, similar to output 250 in FIG. 2, may be configured to supply recovered data to other portions of a larger system incorporating a CDR according to partially embedded CDR architecture 300.

Demultiplexer 320 of FIG. 3 may comprise any device that can be configured to convert one or more relatively narrow high frequency input datastreams to relatively wide low frequency output datastreams, similar to demultiplexer 220 in FIG. 2, and such conversion may be performed according to a first latency primarily due to the demultiplexer operation, for example. In addition, demultiplexer 320 may also be configured to include functionality of a fully embedded phase error processor and at least a first stage of a digital loop filter, for example, leaving un-embedded digital loop filter second stage 344 to perform further digital loop filter operations.

Thus, the portion of the total latency of partially embedded CDR architecture 300 due to demultiplexer 320, the fully embedded phase error processor, and the partially embedded digital loop filter may be less than the sum of a first latency due to demultiplexer 320 and a third latency due to digital loop filter operations, a portion of which is due to un-embedded digital loop filter second stage 344 and necessarily increases an overall latency above that of just demultiplexer 320 alone.

As can be seen from FIG. 3, demultiplexer 320 may be configured, similar to demultiplexer 220 in FIG. 2, to accept serialized datastreams and produce at least one 32-bit parallelized datastream and an input datastream for un-embedded digital loop filter second stage 344. Demultiplexer 320 may comprise a demultiplexer chain of two stages, instead of three stages as with demultiplexer 220 in FIG. 2, such that first demultiplexer stage 322 comprises a fully embedded phase error processor and second demultiplexer stage 324 comprises a digital loop filter first stage, leaving un-embedded digital loop filter second stage 344.

Although un-embedded digital loop filter second stage 344 is outside demultiplexer 320, it should be understood that partially embedded CDR architecture 300 still provides substantial latency advantages over, for example, conventional digital CDR architecture 100. As noted above, even partial embedding may allow embodiments of the present inventive concepts to include mixed signal and/or simplified implementations of a phase error processor and digital loop filter that allow latencies to scale with input frequencies better than conventional architectures.

For example, even though a minimum total latency of partially embedded CDR architecture 300 includes a portion due to un-embedded digital loop filter second stage 344, the input to un-embedded digital loop filter second stage 344 may be relatively simplified as compared to that conventionally seen by digital loop filter 340 in FIG. 1, for example. Furthermore, un-embedded digital loop filter second stage 344 may be itself simplified over, for example, digital loop filter 340 in FIG. 1, such that a latency due to un-embedded digital loop filter second stage 344 may be able to scale with input frequencies that are higher than those compatible with reliable operation of digital loop filter 340 in FIG. 1. Thus, partially embedded CDR architecture 300 provides many of the same benefits over conventional CDR architectures that fully embedded CDR architecture 200 does, as described above. It should be understood that embodiments of the present inventive concepts may be implemented as full rate, half rate, and quarter rate receivers, for example, and may incorporate additional circuitry, such as additional samplers, for example, to enable such alternative implementations.

As can be understood from the above, embodiments of the present inventive concepts may improve overall latency and thus operate reliably with higher input frequencies by embedding as much phase error processor and digital loop filter operations within a demultiplexer as possible and by simplifying those operations as much as possible. FIGS. 4a, 4b, 5 and 6 illustrate architectural designs for further reducing latency of embedded CDR architectures.

Figures 4A, 4B:
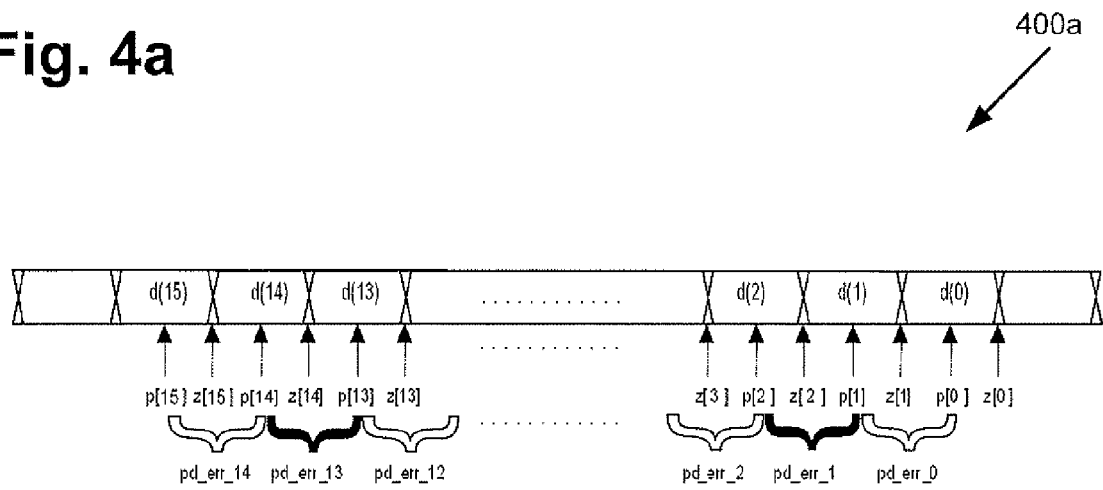
FIG. 4a presents a schematic illustrating a definition of phase error for a low latency high bandwidth CDR architecture, according to one embodiment of the present invention.
FIG. 4b presents a truth table illustrating one aspect of a single edge phase error processing structure for a low latency high bandwidth CDR architecture, according to one embodiment of the present invention.

FIG. 4a is a schematic illustrating one method for defining phase error for a datastream. With reference to fully embedded CDR architecture 200 in FIG. 2, individual phase errors may be calculated using data and phase sample datastreams provided by, for example, samplers 212 and 214. After such calculation, an overall datastream phase error may be calculated, in some embodiments, by summing consecutive phase errors using a phase error summer, which may comprise one or more stages, as will be discussed further below. A phase error processor may periodically update such a datastream phase error in order to retain lock to an input datastream, for example.

Individual phase errors can be calculated using three conditions of data transition: using both rising and falling edges of the data for phase error computation (e.g., dual edge phase detection); using only rising (e.g., single edge phase detection), or using only falling (e.g., single edge phase detection). A number of phase errors per bit of data is double in dual edge phase detection as compared to single edge, and so dual edge phase detection may utilize more complex circuitry than single edge phase detection. Thus, in some embodiments, single edge phase detection may be used to help allow more phase error processor and digital loop filter operations to be embedded into, for example, demultiplexer 220 in FIG. 2.

Figure 5:
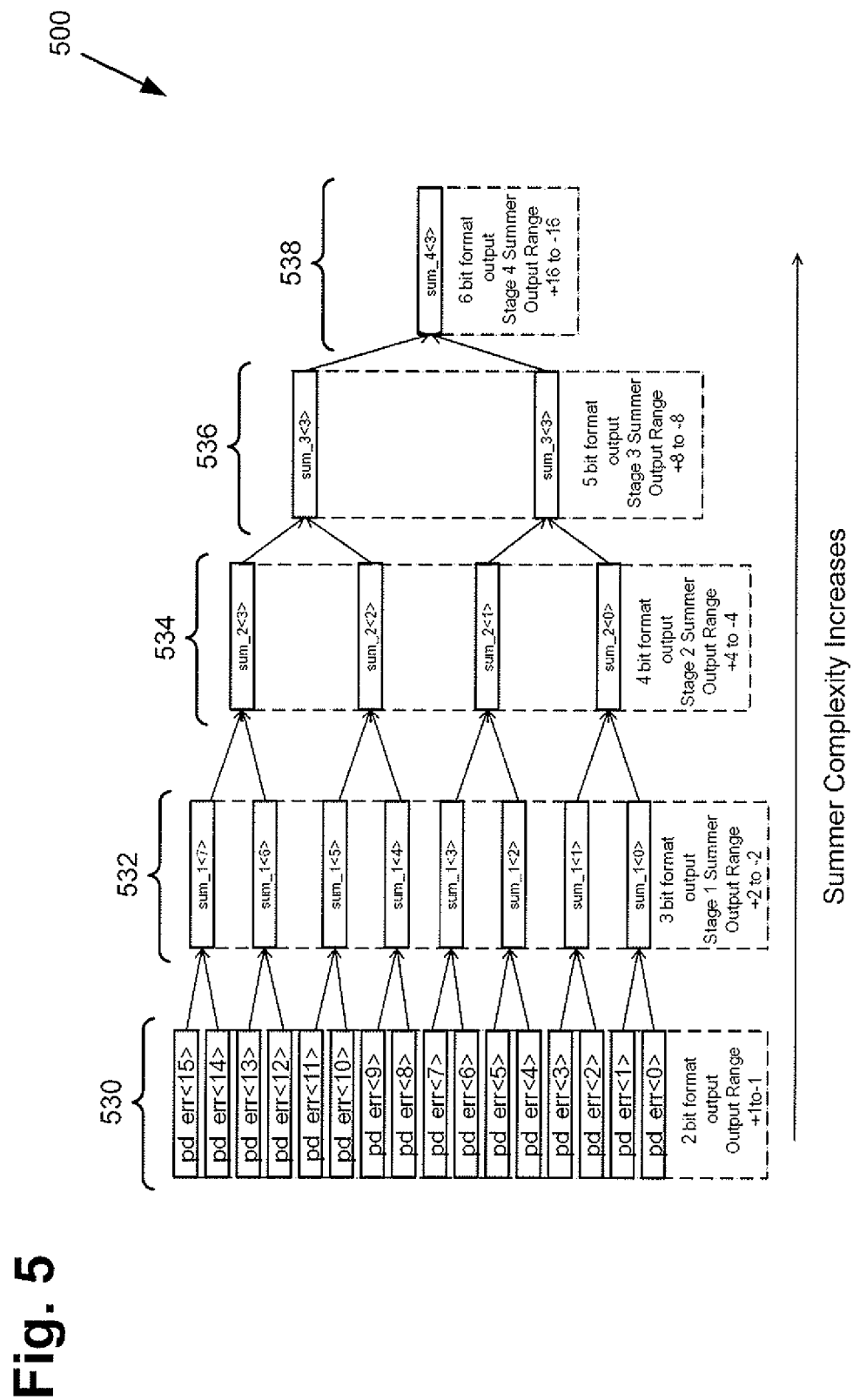
FIG. 5 presents a flow diagram illustrating a dual edge phase error processing structure for a low latency high bandwidth CDR architecture, according to one embodiment of the present invention.

For example, FIG. 5 is a diagram illustrating a dual edge phase error processing structure 500 for use with a phase error processor comprising a multi-stage phase error summer used to sum dual edge detected phase errors. As shown in FIG. 5, dual edge phase error processing structure 500 may comprise phase error stack 530 and a phase error summer comprising summer stages 532, 534, 536 and 538. As can be seen from FIG. 5, because dual edge phase detection results in a bit width for an initial sum of consecutive phase errors in a datastream wider than the bit width for the consecutive phase errors themselves, each subsequent stage of the dual edge phase error summer requires <stage number>+2 bits for each sum.

Figure 6:
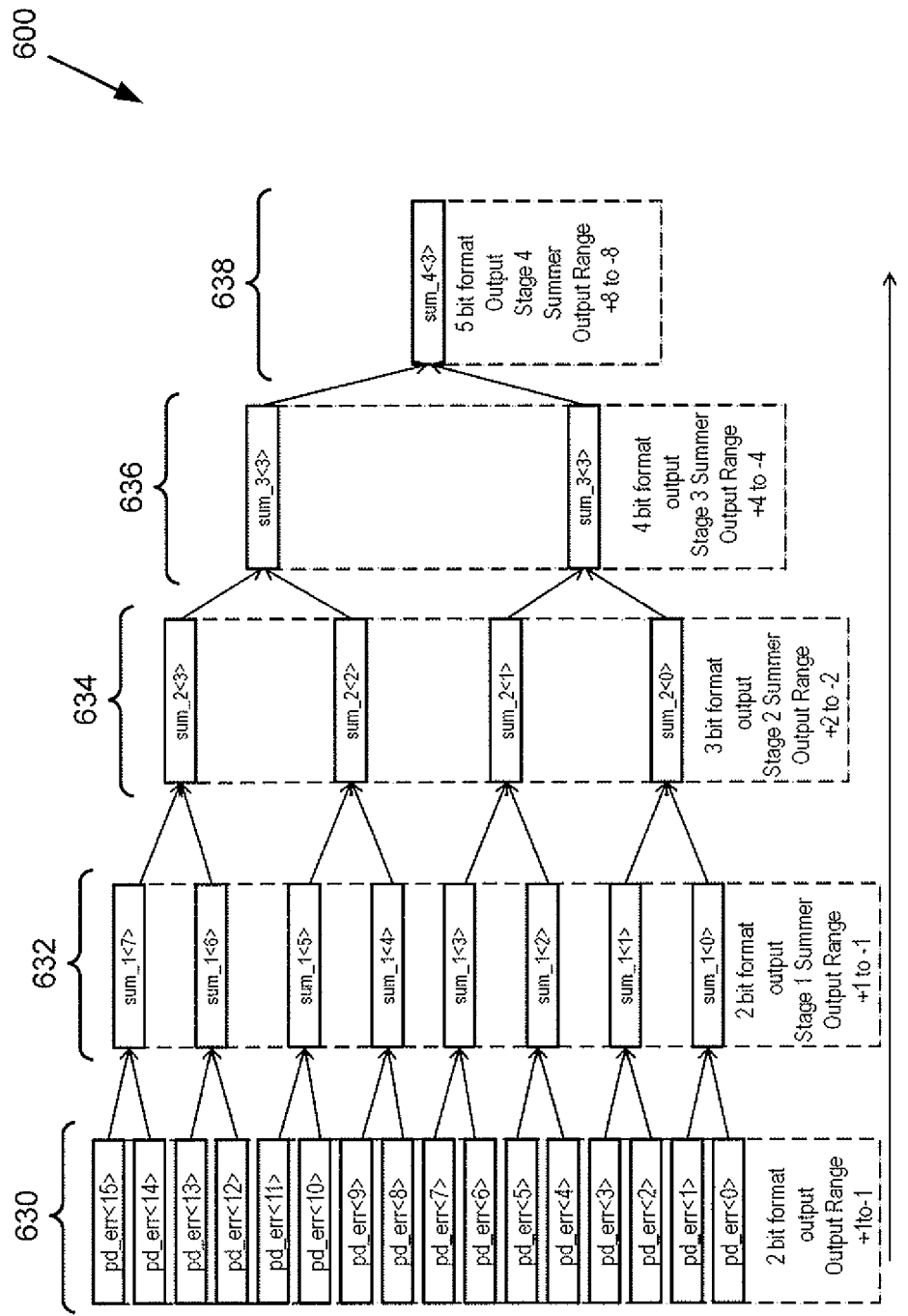
FIG. 6 presents a flow diagram illustrating a single edge phase error processing structure for a low latency high bandwidth CDR architecture, according to one embodiment of the present invention.

By contrast, FIG. 6 is a diagram illustrating a single edge phase error processing structure 600 for use with a phase error processor comprising a multi-stage phase error summer used to sum single edge detected phase errors. As shown in FIG. 6, single edge phase error processing structure 600 may comprise phase error stack 630 and a phase error summer comprising summer stages 632, 634, 636 and 638. However, as can be seen from FIG. 6, because single edge phase detection results in a bit width for an initial sum of consecutive phase error in a datastream that is equal to the bit width for the consecutive phase errors, each subsequent stage of the single edge phase error summer requires only <stage number>+1 bits for each sum. This reduction in bit width can drastically reduce complexity of the single edge summer as compared to the dual edge summer, thus allowing additional phase error processor and digital loop filter operations to be embedded into, for example, demultiplexer 220.

For example, FIG. 4b presents a truth table illustrating how a single edge summer may embed a first stage sum of consecutive phase errors into only a 2-bit format. In single edge phase detection, consecutive phase errors cannot consist of early-early, late-late, early-late or late-early. Thus, truth table 400b is a complete truth table of a sum of possible adjacent or consecutive phase errors, and all possible outcomes may be embedded into, for example, a 2-bit 2's compliment output. As such, embodiments of the present inventive concepts may comprise a phase error summer utilizing a 2's compliment based single edge phase error processing structure, such as single edge phase error processing structure 600 in FIG. 6 for example, to produce a datastream phase error of a relatively high frequency input datastream. Furthermore, because such embodiments may utilize a 2's compliment based single edge phase error processing structure, a first summer stage of such phase error summer may comprise a very simple and fast array of OR gates.

In addition to the above, a phase error summer according to the present inventive concepts may be further simplified by, for example, reducing a number of input phase errors used to calculate a total phase error, such that minimal additional uncertainty in a calculated phase error is exchanged for increased simplification of a phase error processor incorporating such phase error summer. For instance, in one embodiment, dual edge phase error processing structure 500 in FIG. 5 may be configured such that a value of zero is always assigned to, for example, pd_error<15> in phase error stack 530. By doing so, a phase error summer comprising summer stages 532, 534, 536 and 538 may be simplified such that summer output stage 538 may utilize at least one less bit than dictated by the rule for a dual edge summer stated above. While this simplification does increase an uncertainty in a calculated phase error, a resulting overall simplification to a phase error processor and subsequent circuitry, such as a subsequent digital loop filter for example, may far outweigh any detriment to operation of a constituent CDR.

In like manner, in another embodiment, single edge phase error processing structure 600 in FIG. 6 may be configured such that a constant value is assigned to, for example, 2 phase errors in phase error stack 630, similarly resulting in output stage 638 utilizing at least one less bit than dictated by the rule for a single edge summer stated above. More generally, any number of phase errors in a phase error stack may be assigned one or more individually constant values, for example, in any pattern, for instance, so as to trade additional uncertainty in a calculated phase error for an overall simplification of a phase error processor, a subsequent digital loop filter, or both.

Because an implementation of a phase error summer according to the present inventive concepts can be simplified using, for example, single edge phase error processing structure 600 of FIG. 6, embodiments incorporating such concepts may allow further portions or stages of a phase error processor and digital loop filter to be embedded into, for example, demultiplexer 220 of FIG. 2, thus further decreasing overall latency of such embodiments, with all the advantages discussed above. For example, a phase error processor may comprise a phase error summer at least partially embedded into a demultiplexer such that portions of the demultiplexer and the embedded phase error summer comprise mixed signal portions of each, thereby increasing an ability for a constituent CDR architecture to operate with very high frequency input datastreams, as explained above. As such, embodiments of the present inventive concepts provide an embedded CDR architecture with structurally improved latencies that, in some embodiments, can scale more easily with high frequency input datastreams.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

What is claimed is:

1. A clock and data recovery (CDR) system comprising:
a demultiplexer configured to convert a first frequency input datastream to a second frequency output datastream, having a frequency lower than the first frequency input datastream, the demultiplexer having a first latency; and
a phase error processor at least partially embedded into the demultiplexer and configured to determine a datastream phase error of the first frequency input datastream, the phase error processor having a second latency,
wherein the phase error processor at least partially embedded into the demultiplexer causes a portion of a total latency of the CDR system due to the demultiplexer and the phase error processor to be less than a sum of the first and second latencies.

2. The CDR system of claim 1, wherein the phase error processor is fully embedded into the demultiplexer and the portion of the total latency of the CDR system due to the demultiplexer and the phase error processor is approximately equal to the first latency.

3. The CDR system of claim 1, wherein the demultiplexer comprises a demultiplexer chain including a plurality of demultiplexer stages, the phase error processor being at least partially embedded into a first stage of the plurality of demultiplexer stages.

4. The CDR system of claim 1, wherein phase error processor comprises a phase error summer that is at least partially embedded into the demultiplexer, the phase error summer utilizing a dual edge phase error processing structure to produce the datastream phase error of the first frequency input datastream.

5. The CDR system of claim 1, wherein phase error processor comprises a phase error summer that is at least partially embedded into the demultiplexer, the phase error summer utilizing a single edge phase error processing structure to produce the datastream phase error of the first frequency input datastream.

6. The CDR system of claim 1, wherein phase error processor comprises a phase error summer that is at least partially embedded into the demultiplexer, the phase error summer utilizing a 2's compliment based single edge phase error processing structure to produce the datastream phase error of the first frequency input datastream.

7. The CDR system of claim 1, wherein phase error processor comprises a phase error summer that is at least partially embedded into the demultiplexer,
the phase error summer utilizes a 2's compliment based single edge phase error processing structure to produce the datastream phase error of the first frequency input datastream, and
a first summer stage of the phase error summer comprising an array of OR gates.

8. The CDR system of claim 1, wherein the demultiplexer comprises a demultiplexer chain that includes a plurality of demultiplexer stages, the plurality of demultiplexer stages comprising a mixed signal implementation of the demultiplexer.

9. The CDR system of claim 1, wherein the demultiplexer comprises a demultiplexer chain that includes a first plurality of demultiplexer stages and the phase error processor comprises a second plurality of phase error processor stages, and
the first plurality of demultiplexer stages includes a first mixed signal implementation of the demultiplexer and the second plurality of phase error processor stages includes a second mixed signal implementation of the phase error processor.

10. The CDR system of claim 1, further comprising:
a digital loop filter configured to provide a loop output for the CDR system according to a third latency,
wherein the phase error processor at least partially embedded into the demultiplexer causes a portion of a total latency of the CDR system due to the demultiplexer, the phase error processor and the digital loop filter to be less than a sum of the first, second and third latencies.

11. The CDR system of claim 1, wherein the phase error processor comprises a phase error summer at least partially embedded into the demultiplexer, and the phase error summer utilizes a phase error structure where at least one phase error in a phase error stack of the phase error structure is assigned a corresponding at least one individually constant value.

12. The CDR system of claim 1, wherein the CDR system comprises a receiver that is at least one of a full rate, a half rate and a quarter rate receiver.

13. A clock and data recovery (CDR) system comprising:
a demultiplexer configured to convert a first frequency input datastream to a second frequency output datastream, having a frequency lower than the first frequency input datastream, the demultiplexer having a first latency;
a phase error processor embedded into the demultiplexer and configured to determine a datastream phase error of the first frequency input datastream, the phase error processor having a second latency; and
a digital loop filter at least partially embedded into the demultiplexer and configured to provide a loop output for the CDR system, the digital loop filter having a third latency,
wherein the phase error processor embedded into the demultiplexer and the digital loop filter at least partially embedded into the demultiplexer causes a portion of a total latency of the CDR system due to the demultiplexer, the phase error processor and the digital loop filter to be less than a sum of the first and third latencies.

14. The CDR system of claim 13, wherein the digital loop filter is fully embedded into the demultiplexer and the portion of the total latency of the CDR system due to the demultiplexer, the phase error processor and the digital loop filter is approximately equal to the first latency.

15. The CDR system of claim 13, wherein the demultiplexer comprises a demultiplexer chain that includes including a plurality of demultiplexer stages, the phase error processor being at least partially embedded into a first stage of the plurality of demultiplexer stages.

16. The CDR system of claim 13, wherein phase error processor comprises a phase error summer that is at least partially embedded into the demultiplexer, and the phase error summer utilizes a dual edge phase error processing structure to produce the datastream phase error of the first frequency input datastream.

17. The CDR system of claim 13, wherein phase error processor comprises a phase error summer that is at least partially embedded into the demultiplexer, and the phase error summer utilizes a single edge phase error processing structure to produce the datastream phase error of the first frequency input datastream.

18. The CDR system of claim 13, wherein phase error processor comprises a phase error summer that is at least partially embedded into the demultiplexer, and the phase error summer utilizes a 2's compliment based single edge phase error processing structure to produce the datastream phase error of the first frequency input datastream.

19. The CDR system of claim 13, wherein phase error processor comprises a phase error summer that is at least partially embedded into the demultiplexer, the phase error summer utilizes a 2's compliment based single edge phase error processing structure to produce the datastream phase error of the first frequency input datastream, and a first summer stage of the phase error summer includes an array of OR gates.

20. The CDR system of claim 13, wherein the demultiplexer comprises a demultiplexer chain that includes a plurality of demultiplexer stages, and the plurality of demultiplexer stages includes a mixed signal implementation of the demultiplexer.

21. The CDR system of claim 13, wherein the demultiplexer comprises a demultiplexer chain that includes a first plurality of demultiplexer stages and the phase error processor comprises a second plurality of phase error processor stages, and the first plurality of demultiplexer stages includes a first mixed signal implementation of the demultiplexer and the second plurality of phase error processor stages includes a second mixed signal implementation of the phase error processor.

22. The CDR system of claim 13, wherein the demultiplexer comprises a demultiplexer chain that includes a first plurality of demultiplexer stages and the digital loop filter comprises a second plurality of digital loop filter stages, and the first plurality of demultiplexer stages includes a first mixed signal implementation of the demultiplexer and the second plurality of digital loop filter stages includes a second mixed signal implementation of the digital loop filter.

23. The CDR system of claim 13, wherein the phase error processor comprises a phase error summer at least partially embedded into the demultiplexer, and the phase error summer utilizes a phase error structure where at least one phase error in a phase error stack of the phase error structure is assigned a corresponding at least one individually constant value.

24. The CDR system of claim 13, wherein the CDR system comprises a receiver that is at least one of a full rate, a half rate and a quarter rate receiver.

* * * * *